(12) United States Patent
Chen et al.

(10) Patent No.: US 11,320,744 B2
(45) Date of Patent: May 3, 2022

(54) METHOD AND APPARATUS FOR CONTROLLING EXTREME ULTRAVIOLET LIGHT

(71) Applicant: TAIWAN SEMICONDUCTOR MANUFACTURING CO., LTD., Hsinchu (TW)

(72) Inventors: Ssu-Yu Chen, New Taipei (TW); Shang-Chieh Chien, New Taipei (TW); Li-Jui Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 165 days.

(21) Appl. No.: 16/882,086

(22) Filed: May 22, 2020

(65) Prior Publication Data
US 2021/0364931 A1 Nov. 25, 2021

(51) Int. Cl.
*G03F 7/20* (2006.01)
*H05G 2/00* (2006.01)

(52) U.S. Cl.
CPC ........ *G03F 7/70558* (2013.01); *G03F 7/2004* (2013.01); *G03F 7/70025* (2013.01); *G03F 7/70033* (2013.01); *G03F 7/70041* (2013.01); *G03F 7/70116* (2013.01); *G03F 7/70191* (2013.01); *H05G 2/003* (2013.01); *H05G 2/008* (2013.01)

(58) Field of Classification Search
CPC ....................................................... G03F 7/07
See application file for complete search history.

(56) References Cited

U.S. PATENT DOCUMENTS

| | | | |
|---|---|---|---|
| 8,764,995 B2 | 7/2014 | Chang et al. | |
| 8,796,666 B1 | 8/2014 | Huang et al. | |
| 8,828,625 B2 | 9/2014 | Lu et al. | |
| 8,841,047 B2 | 9/2014 | Yu et al. | |
| 8,877,409 B2 | 11/2014 | Hsu et al. | |
| 9,093,530 B2 | 7/2015 | Huang et al. | |
| 9,184,054 B1 | 11/2015 | Huang et al. | |
| 9,256,123 B2 | 2/2016 | Shih et al. | |
| 9,529,268 B2 | 12/2016 | Chang et al. | |
| 9,548,303 B2 | 1/2017 | Lee et al. | |
| 2020/0060015 A1* | 2/2020 | Hsu | H05G 2/008 |

* cited by examiner

*Primary Examiner* — Michelle M Iacoletti
(74) *Attorney, Agent, or Firm* — Maschoff Brennan

(57) ABSTRACT

In accordance with some embodiments, a method of controlling an extreme ultraviolet (EUV) radiation in lithography system is provided. The method includes generating a plurality of target droplets. The method also includes generating a pre-pulse and a main pulse from an excitation laser module to generate EUV light and reflecting the EUV light by a collector mirror. The method further includes measuring a separation between a pre-pulse and a main pulse. Moreover, the method includes determining whether the separation between the pre-pulse and the main pulse in the y-axis is changed, if not adjusting a configurable parameter of the excitation laser module to set the variation in the energy of the EUV light within an acceptable range.

20 Claims, 15 Drawing Sheets

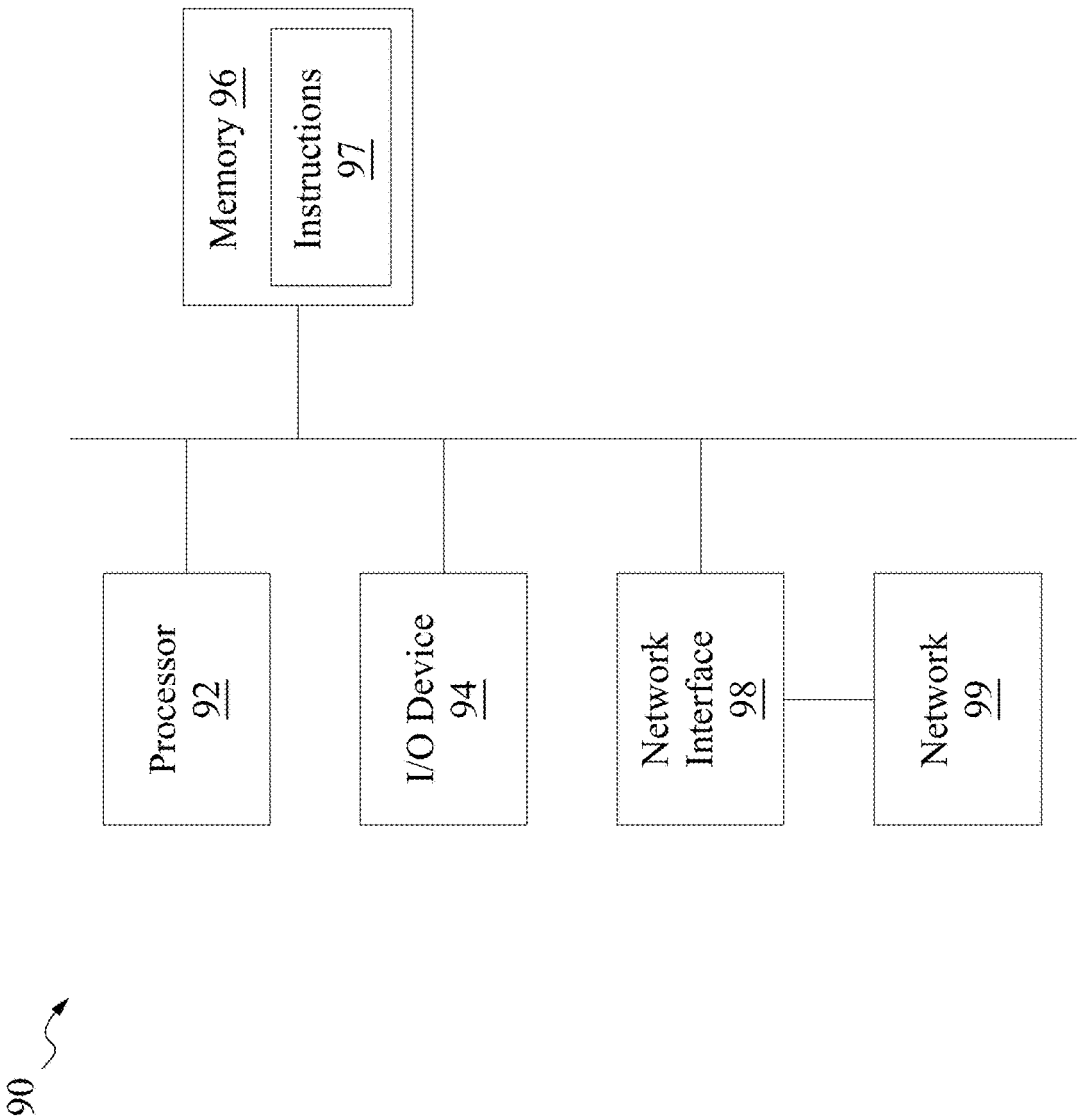

METHOD AND APPARATUS FOR CONTROLLING EXTREME ULTRAVIOLET LIGHT

BACKGROUND

The demand for computational power has increased exponentially. This increase in computational power is met by increasing the functional density, i.e., number of interconnected devices per chip, of semiconductor integrated circuits (ICs). With the increase in functional density, the size of individual devices on the chip has decreased. The decrease in size of components in ICs has been met with advancements in semiconductor manufacturing techniques such as lithography.

For example, the wavelength of radiation used for lithography has decreased from ultraviolet to deep ultraviolet (DUV) and, more recently to extreme ultraviolet (EUV). Further decreases in component size require further improvements in resolution of lithography which are achievable using extreme ultraviolet lithography (EUVL). EUVL employs radiation having a wavelength of about 1-100 nm.

One method for producing EUV radiation is laser-produced plasma (LPP). In an LPP based EUV source a high-power laser beam is focused on small tin droplet targets to form highly ionized plasma that emits EUV radiation with a peak maximum emission at 13.5 nm. The intensity of the EUV radiation produced by LPP depends on the effectiveness with which the high-powered laser can produce the plasma from the target droplet targets. Synchronizing the pulses of the high-powered laser with generation and movement of the target droplet targets can improve the efficiency of an LPP based EUV radiation source.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 12 shows a block diagram of a controller module, in accordance with some embodiments of the present disclosure.

DETAILED DESCRIPTION

Figure 1:
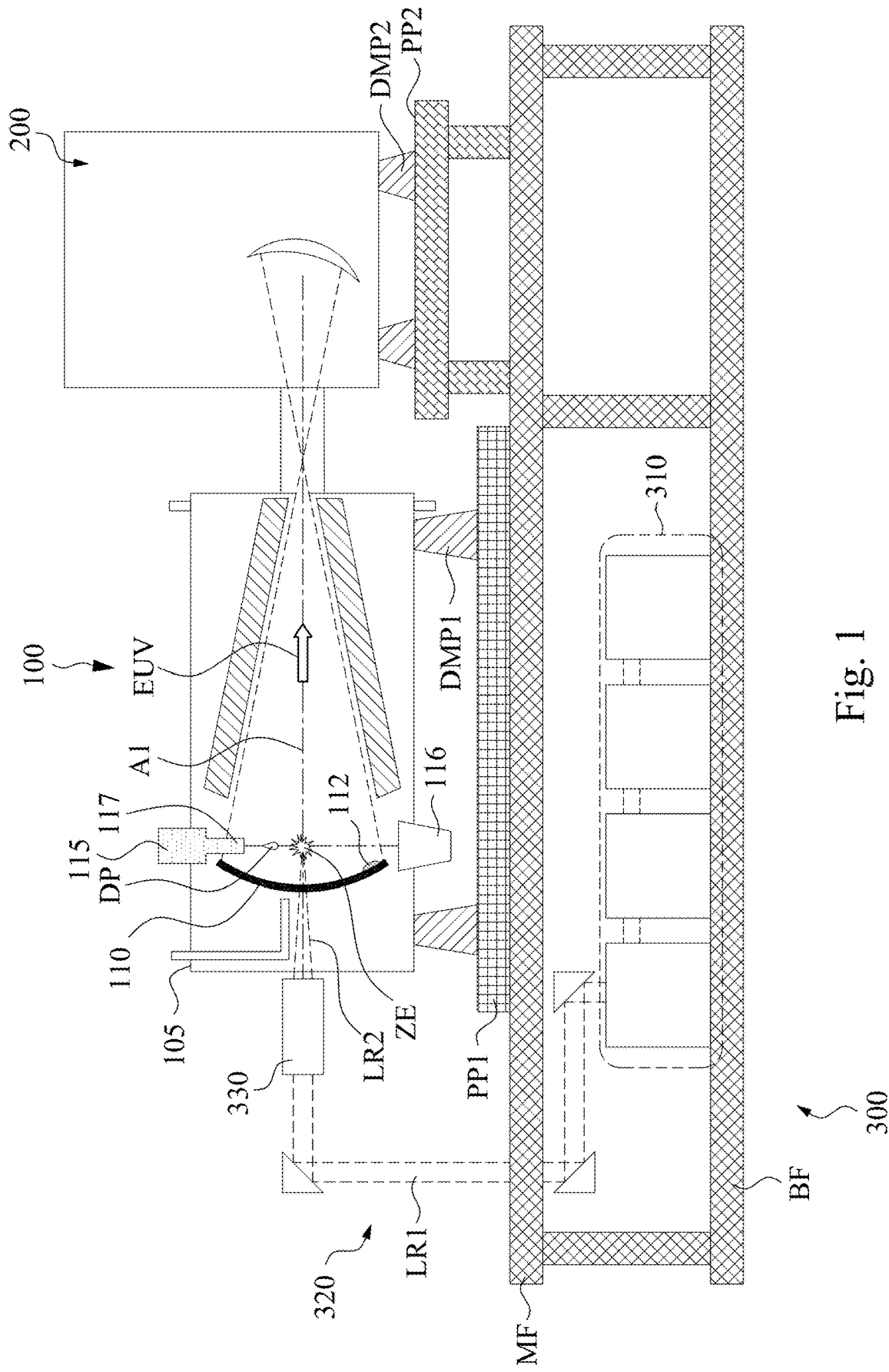
FIG. 1 illustrates a schematic view of an EUV lithography system with a laser produced plasma (LPP) EUV radiation source, constructed in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first projection over or on a second projection in the description that follows may include embodiments in which the first and second projections are formed in direct contact, and may also include embodiments in which additional features may be formed between the first and second projections, such that the first and second projections may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to extreme ultraviolet (EUV) lithography system and methods. More particularly, it is related to apparatuses and methods for controlling an excitation laser used in a laser produced plasma (LPP)-based EUV radiation source. The excitation laser heats metal (e.g., tin) target droplets in the LPP chamber to ionize the target droplets to a plasma which emits the EUV radiation. For optimum heating of the target droplets, the target droplets have to arrive at the focal point of the excitation laser at the same time as an excitation pulse from the excitation laser. Thus, synchronization between the target droplets and trigger time for triggering an excitation pulse from the excitation laser contributes to efficiency and stability of the LPP EUV radiation source. One embodiment of the present disclosure is directed to controlling the excitation laser to provide optimum heating of target droplets.

FIG. 1 is a schematic view of an EUV lithography system with a LPP-based EUV radiation source, in accordance with some embodiments of the present disclosure. The EUV lithography system includes an EUV radiation source 100 to generate EUV radiation, an exposure tool 200, such as a scanner, and an excitation laser module 300. As shown in FIG. 1, in some embodiments, the EUV radiation source 100 and the exposure tool 200 are installed on a main floor MF of a clean room, while the excitation laser module 300 is installed in a base floor BF located under the main floor. Each of the EUV radiation source 100 and the exposure tool 200 are placed over pedestal plates PP1 and PP2 via dampers DMP1 and DMP2, respectively. The EUV radiation source 100 and the exposure tool 200 are coupled to each other by a coupling mechanism, which may include a focusing unit.

The lithography system is an extreme ultraviolet (EUV) lithography system designed to expose a resist layer by EUV light (also interchangeably referred to herein as EUV radiation). The resist layer is a material sensitive to the EUV light. The EUV lithography system employs the EUV radiation source 100 to generate EUV light, such as EUV light having a wavelength ranging between about 1 nm and about 100 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure tool 200 includes various reflective optical components, such as convex/concave/flat mirrors, a mask holding mechanism including a mask stage, and wafer holding mechanism. The EUV radiation generated by the EUV radiation source 100 is guided by the reflective optical components onto a mask secured on the mask stage. In some embodiments, the mask stage includes an electrostatic chuck (e-chuck) to secure the mask. Because gas molecules absorb EUV light, the lithography system for the EUV lithography patterning is maintained in a vacuum or a-low pressure environment to avoid EUV intensity loss.

In the present disclosure, the terms mask, photomask, and reticle are used interchangeably. In the present embodiment, the mask is a reflective mask. In an embodiment, the mask includes a substrate with a suitable material, such as a low thermal expansion material or fused quartz. In various examples, the material includes $TiO_2$ doped $SiO_2$, or other suitable materials with low thermal expansion. The mask includes multiple reflective layers (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light. The mask may further include a capping layer, such as ruthenium (Ru), disposed on the ML for protection. The mask further includes an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask.

The exposure tool 200 includes a projection optics module for imaging the pattern of the mask on to a semiconductor substrate with a resist coated thereon secured on a substrate stage of the exposure tool 200. The projection optics module generally includes reflective optics. The EUV radiation (EUV light) directed from the mask, carrying the image of the pattern defined on the mask, is collected by the projection optics module, thereby forming an image on the resist.

In various embodiments of the present disclosure, the semiconductor substrate is a semiconductor wafer, such as a silicon wafer or other type of wafer to be patterned. The semiconductor substrate is coated with a resist layer sensitive to the EUV light in presently disclosed embodiments. Various components including those described above are integrated together and are operable to perform lithography exposing processes.

The lithography system may further include other modules or be integrated with (or be coupled with) other modules.

As shown in FIG. 1, the EUV radiation source 100 includes a target droplet generator 115 and a collector mirror 110, enclosed by a chamber 105. The target droplet generator 115 generates a plurality of target droplets DP, which are supplied into the chamber 105 through a nozzle 117. In some embodiments, the target droplets DP are tin (Sn), lithium (Li), or an alloy of Sn and Li. In some embodiments, the target droplets DP each have a diameter in a range from about 10 microns (µm) to about 100 µm. For example, in an embodiment, the target droplets DP are tin droplets, each having a diameter of about 10 µm, about 25 µm, about 50 µm, or any diameter between these values. In some embodiments, the target droplets DP are supplied through the nozzle 117 at a rate in a range from about 50 droplets per second (i.e., an ejection-frequency of about 50 Hz) to about 50,000 droplets per second (i.e., an ejection-frequency of about 50 kHz). For example, in an embodiment, target droplets DP are supplied at an ejection-frequency of about 50 Hz, about 100 Hz, about 500 Hz, about 1 kHz, about 10 kHz, about 25 kHz, about 50 kHz, or any ejection-frequency between these frequencies. The target droplets DP are ejected through the nozzle 117 and into a zone of excitation ZE at a speed in a range from about 10 meters per second (m/s) to about 100 m/s in various embodiments. For example, in an embodiment, the target droplets DP have a speed of about 10 m/s, about 25 m/s, about 50 m/s, about 75 m/s, about 100 m/s, or at any speed between these speeds.

The excitation laser LR2 generated by the excitation laser module 300 is a pulse laser. The laser pulses LR2 are generated by the excitation laser module 300. The excitation laser module 300 may include a laser generator 310, laser guide optics 320 and a focusing assembly 330. In some embodiments, the laser generator 310 includes a carbon dioxide ($CO_2$) or a neodymium-doped yttrium aluminum garnet (Nd:YAG) laser source with a wavelength in the infrared region of the electromagnetic spectrum. For example, the laser generator 310 has a wavelength of 9.4 µm or 10.6 µm, in an embodiment. The laser light LR1 generated by the laser generator 310 is guided by the laser guide optics 320 and focused into the excitation laser LR2 by the focusing assembly 330, and then introduced into the EUV radiation source 100.

In some embodiments, the excitation laser LR2 includes a pre-heat laser and a main laser. In such embodiments, the pre-heat laser pulse (interchangeably referred to herein as "pre-pulse") is used to heat (or pre-heat) a given target droplet to create a low-density target plume with multiple smaller droplets, which is subsequently heated (or reheated) by a pulse from the main laser, generating increased emission of EUV.

In various embodiments, the pre-heat laser pulses have a spot size about 100 μm or less, and the main laser pulses have a spot size in a range of about 150 μm to about 300 μm. In some embodiments, the pre-heat laser and the main laser pulses have a pulse-duration in the range from about 10 ns to about 50 ns, and a pulse-frequency in the range from about 1 kHz to about 100 kHz. In various embodiments, the pre-heat laser and the main laser have an average power in the range from about 1 kilowatt (kW) to about 50 kW. The pulse-frequency of the excitation laser LR2 is matched with the ejection-frequency of the target droplet DP in an embodiment.

The laser light LR2 is directed through windows (or lenses) into the zone of excitation ZE. The windows adopt a suitable material substantially transparent to the laser beams. The generation of the laser pulses is synchronized with the ejection of the target droplets DP through the nozzle 117. As the target droplets move through the excitation zone, the pre-pulses heat the target droplets and transform them into low-density target plumes. A delay between the pre-pulse and the main pulse is controlled to allow the target plume to form and to expand to an optimal size and geometry. In various embodiments, the pre-pulse and the main pulse have the same pulse-duration and peak power. When the main pulse heats the target plume, a high-temperature plasma is generated. The plasma emits EUV radiation EUV, which is collected by the collector mirror 110. The collector mirror 110 further reflects and focuses the EUV radiation for the lithography exposing processes performed through the exposure tool 200.

Figure 2A:
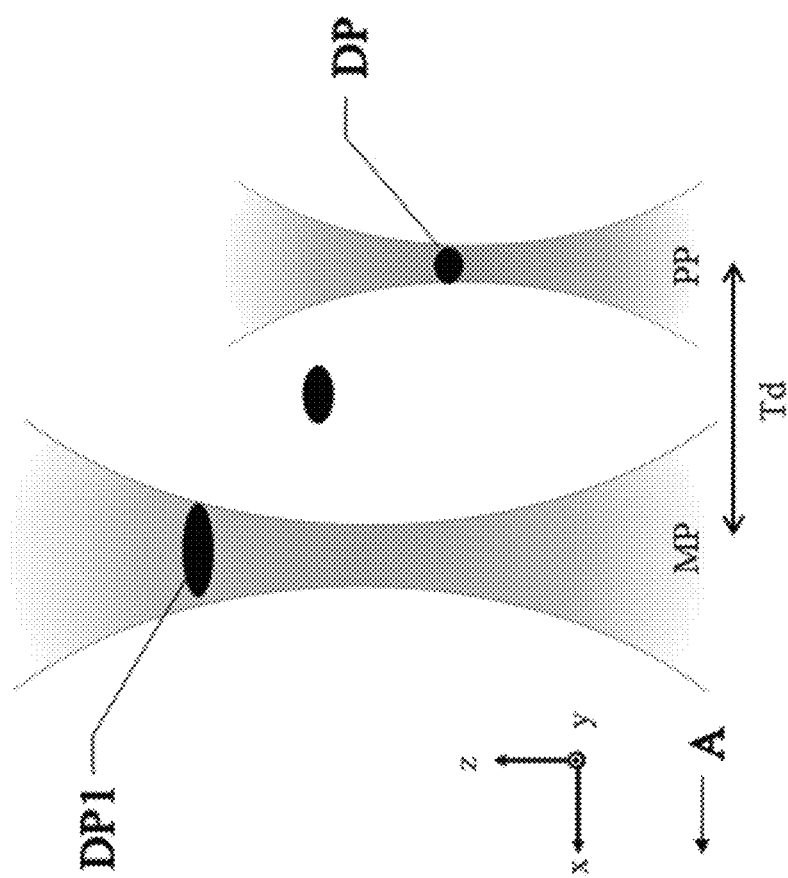
FIGS. 2A, 2B, 2C, 2D, 2E schematically illustrate the movement of target droplet by the pre-pulse in X-Z and X-Y planes respectively, in accordance with some embodiments.

FIG. 2A illustrates the trajectory of the target droplet between the pre-pulse PP and the main pulse MP. As shown in FIG. 2A, a target droplet DP is sequentially irradiated by the pre-pulse PP and the main pulse MP. When the target droplets DP travels along the x-axis in a direction "A" from right to left of FIG. 2A, the target droplet DP is exposed to the pre-pulse PP and the pre-pulse PP heats the target droplet DP causing the target droplet DP to expand, gasify, vaporize, and ionize, and a weak plasma is generated. The following main pulse MP generates a strong plasma and converts the target droplet DP material into a plasma that produces an EUV light emission. There is a time delay Td between the pre-pulse PP and the main-pulse MP. In some embodiments, the time delay Td is in the range from 2500 ns to 3500 ns. In some embodiments, a pre-pulse PP incident upon the target droplet DP has an elliptical cross sectional shape. The elliptical shape of the pre-pulse PP provides an unequal distribution of laser radiation across the surface of the target droplet DP. This unequal distribution provides an unequal temperature and pressure distribution across the target droplet DP which in turn causes the target droplets DP to expand in a non-circular-symmetric manner. As a result of this expansion, the target droplets DP expand to form a generally elliptically shaped target droplet DP1, as shown in FIG. 2A.

The position of the zone of excitation ZE and parameters such as, for example, laser power, time delay between the main pulse and the pre-pulse, focal point of the pre-pulse and/or main pulse, may be determined when an EUV radiation source 100 is set up. The actual position of the zone of excitation ZE and afore-mentioned parameters are then adjusted during wafer exposure using a feedback mechanism in various embodiments. However, these parameters can change over time due to various factors such as, for example, mechanical and/or electrical drift in the radiation source, instability of the target droplet generator, and changes in chamber environment.

Figure 2C:
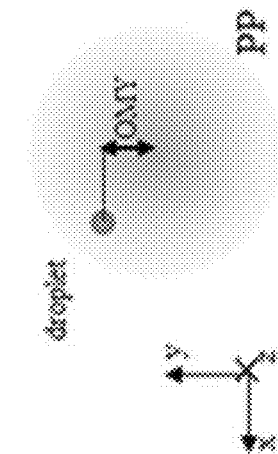
Figure 2E:
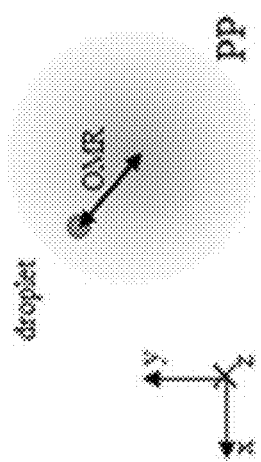
Figure 2B:
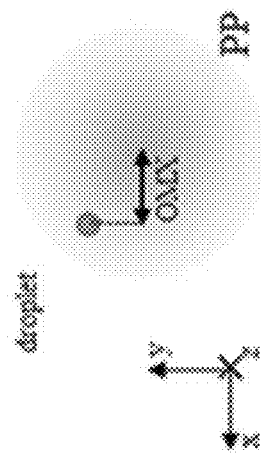
Figure 2D:
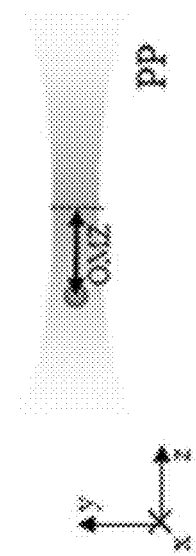

FIG. 2B illustrates an exemplary optical metrology for misalignment in the x-axis OMX. The OMX is defined by a distance in the x-axis between a droplet and the focal point of the pre-pulse PP. Similarly, FIG. 2C illustrates an exemplary optical metrology for misalignment in the y-axis OMY. The OMY is also defined by a distance in the y-axis between the target droplet and the focal point of the pre-pulse PP. In some embodiments, the optical metrology for misalignment in Y axis OMY is in a range of −20 μm to 35 μm. FIG. 2D further illustrates an exemplary optical metrology for misalignment in the z-axis OMZ. Similar to OMX and OMY, the OMZ is defined by a distance in the z-axis between a droplet and the focal point of the pre-pulse PP. FIG. 2E illustrates an exemplary optical metrology for misalignment in radius OMR. The x-axis is in the direction of motion by the target droplet from the target droplet generator 115. The z-axis is along the optical axis A1 of the collector mirror 110. The y-axis is perpendicular to the x-axis and the z-axis.

Figure 3A:
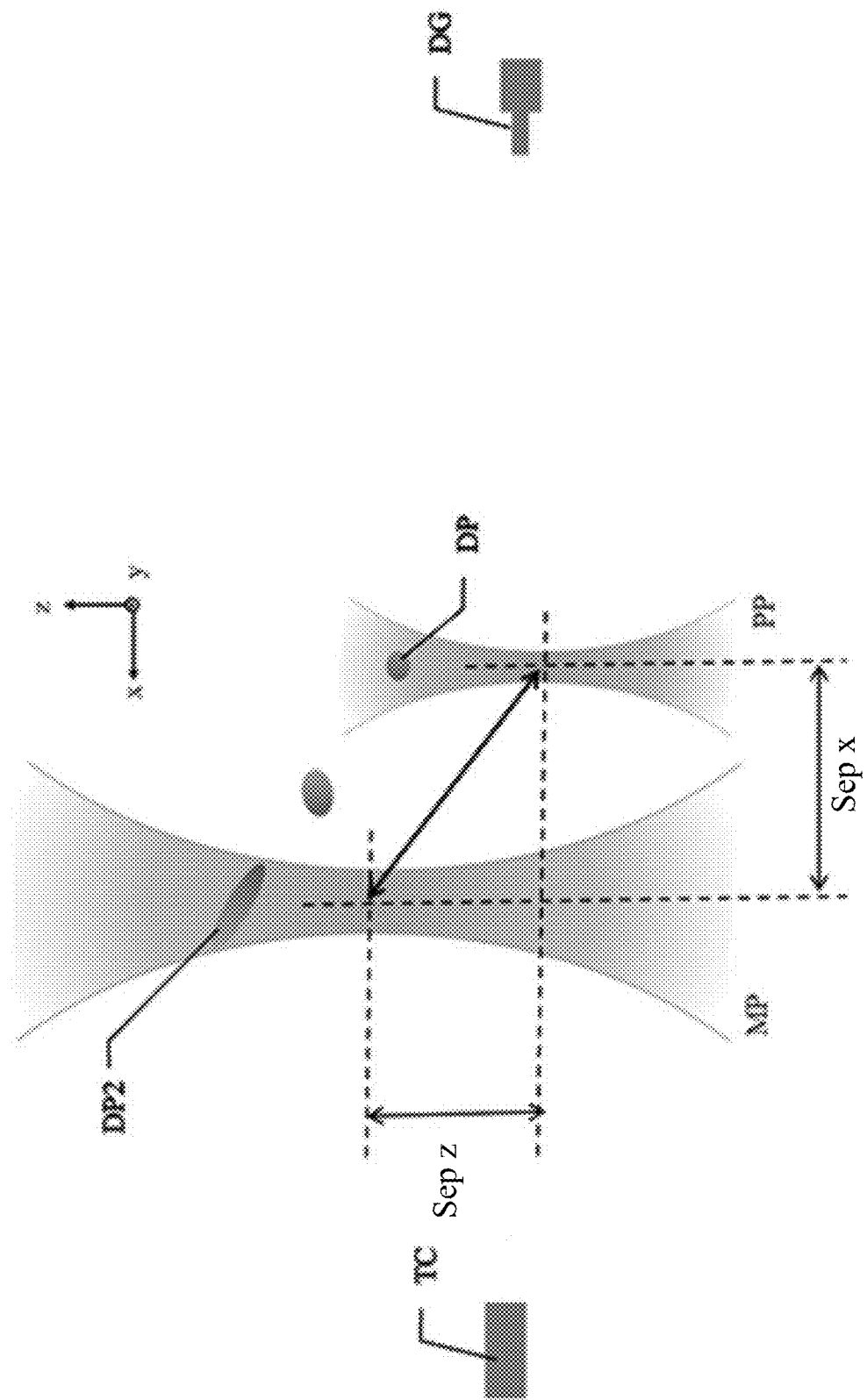
FIG. 3A illustrates the variation in distance between the focal point of the pre-pulse and the focal point of the main pulse hits in x-axis and z-axis caused by beam drift, in accordance with some embodiments.

FIG. 3A illustrates the variation of the spatial separation between the pre-pulse PP and the main-pulse MP, MPPP separation, in the x-axis and y-axis caused by the mechanical and/or electrical drift in the radiation source. For example, after the target droplets DP are heated by the pre-pulse, the trajectory of travel of the target droplets may be determined by an energy imparted by the pre-pulse PP to the target droplet DP. As such, variation in parameters such as, for example, a position at which the pre-pulse hits the target droplet, energy of the pre-pulse and drift of the focus in the pre-pulse can result in a variation in the trajectory of the target droplet. FIG. 3A illustrates variations of the MPPP separation over the time due to mechanical and/or electrical drift of the EUV radiation source 100. This drift results in a change of the trajectory of the target droplet between the pre-pulse and the main pulse because of the change in amount of energy the target droplet receives from the pre-pulse.

Figure 3B:
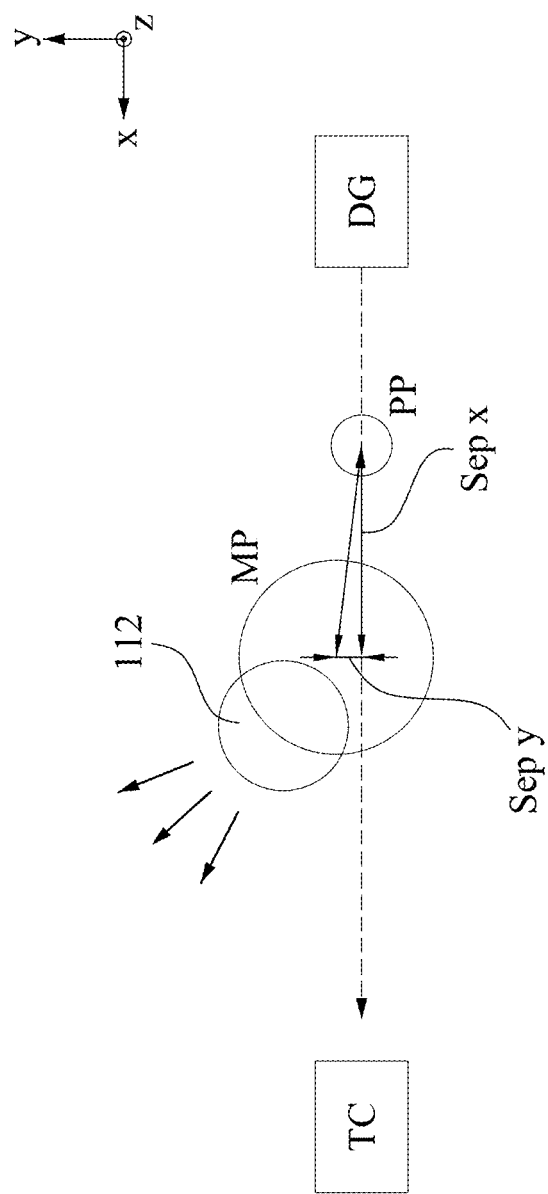
FIG. 3B illustrates the variation in distance between the focal point of the pre-pulse and the focal point of the main pulse hits in x-axis and y-axis caused by beam drift, in accordance with some embodiments.

As shown in FIG. 3A, the target droplet DP is ejected from a droplet generator travelling in a direction to a tin catcher TC. When such mechanical and/or electrical drift occurs in the radiation source, the pre-pulse laser PP causes the target droplet DP to expand in a direction with an angle with respect to a direction of incidence from the pre-pulse laser beam. This gives a rise to a target droplet DP2 which has expanded to form a football-like shape shown in FIG. 3A. In such an embodiment, a spatial separation between the pre-pulse PP and the main-pulse MP, MPPP separation, is defined as a distance between the focal point of the pre-pulse PP and the focal point of the main-pulse MP, which is a 3-D vector contributed by x, y, and z sections. For example, as shown in FIG. 3A, Sep_x is a distance along the x-axis of the MPPP separation and Sep_z is a distance along the z-axis of the MPPP separation. In addition, as shown in FIG. 3B, Sep_y is a distance along the y-axis of the MPPP separation.

Figure 3C:
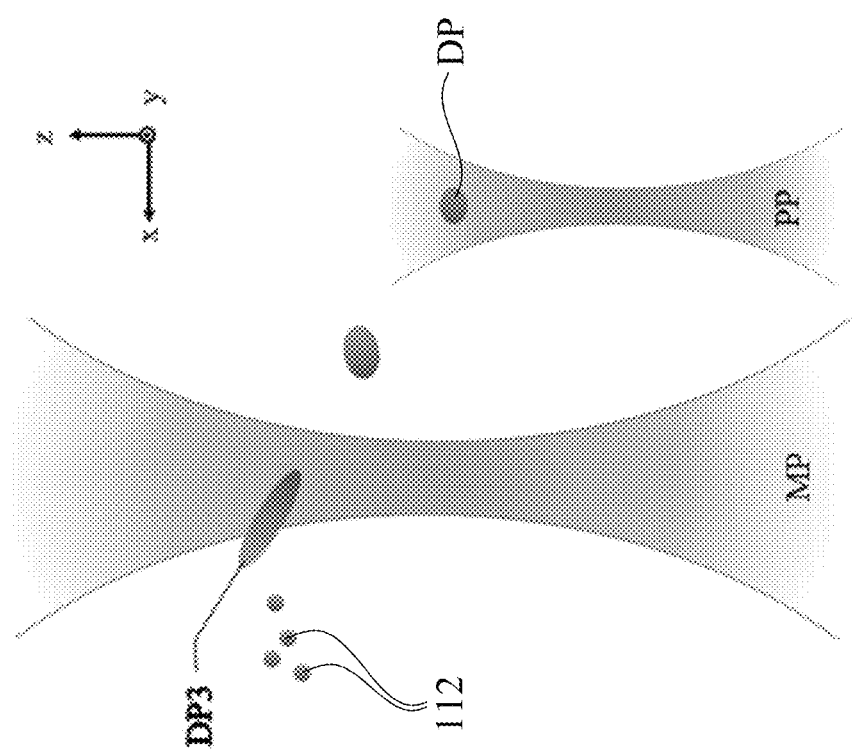
FIG. 3C schematically illustrates the effect of variation in distance between the focal point of the pre-pulse and the focal point of the main pulse hits in x-axis and y-axis.

In some instances as shown in FIG. 3C, the mechanical and/or electrical drift of the EUV radiation source change the trajectory of the main pulse MP causing the main pulse MP to partially miss the target droplet DP3. As a consequence, some of the under heated tin droplets may be converted to plasma and others may be scattered around the chamber as a debris as shown in FIG. 3C. The debris contaminates various surfaces in the chamber including the collector mirror. Moreover, because the amount of plasma is reduced due to the optical misalignment, the EUV energy generated by the misaligned pulse is also reduced, resulting in a dose error during the lithography exposure.

Figure 4A:
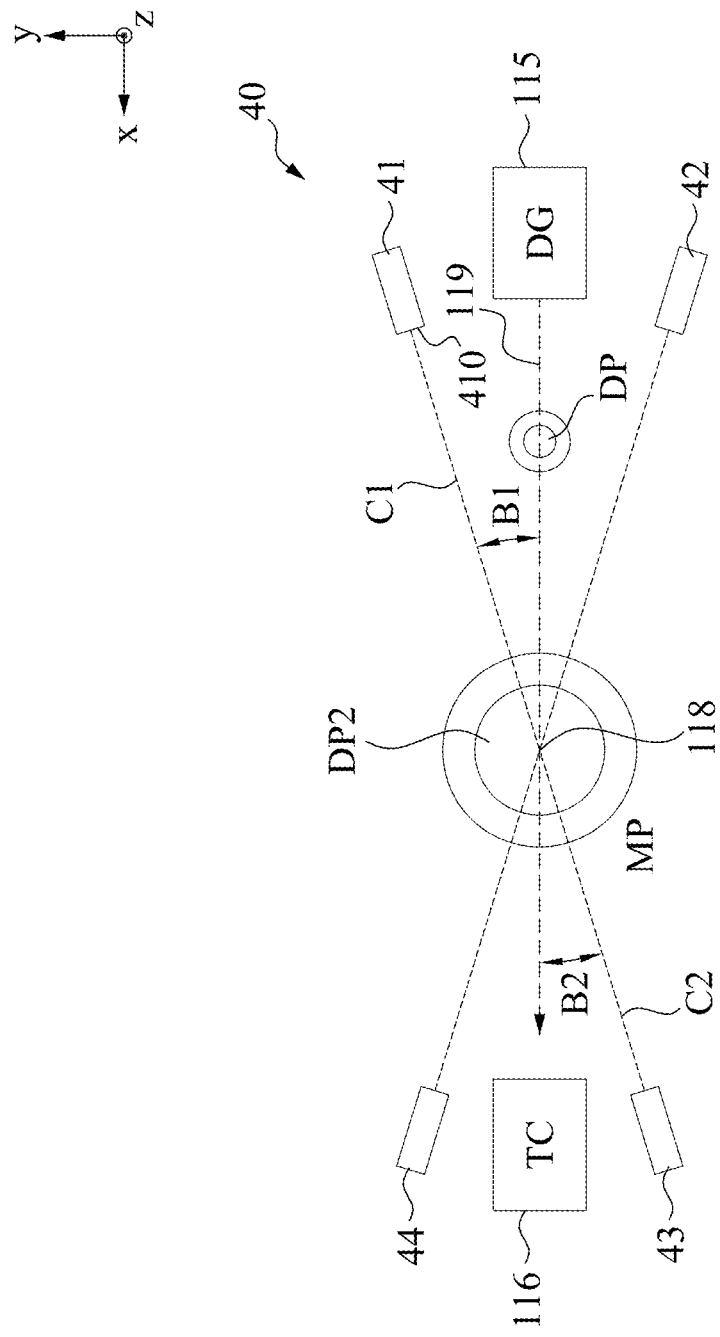
FIG. 4A illustrates a schematic diagram of partial elements in an EUV radiation source, in accordance with some embodiments.

FIG. 4A illustrates a schematic diagram of partial elements in the EUV radiation source 100, in accordance with some embodiments. In some embodiments, the target droplet generator 115 projects droplets DP toward the catcher 116 along a trajectory 119 indicated in dotted line. As seen from the z-axis direction, the trajectory 119 is parallel to the x-axis. The target droplet DP is struck by the pre-pulse PP and transfers to the target droplet DP1 having a larger size and the target droplet DP1 is irradiated by the main pulse MP to convert into plasma.

In some embodiments, an energy sensor module 40 is used to detect energy or intensity of the EVU light produced by the excited droplets DP1 in the EUV radiation source 100. As discussed elsewhere herein, the change in trajectory 119 of the target droplet results in a change in EUV energy generated from the corresponding main pulse. Thus, the amount of EUV energy produced by a given main pulse can be used to adjust for the drift in focus of the pre-pulse and/or the main pulse.

In some embodiments, the energy sensor module 40 includes a number of energy sensors, such as first energy sensor 41, second energy sensor 42, third energy sensor 43 and fourth energy sensor 44. The first energy sensor 41, the second energy sensor 42, the third energy sensor 43 and the fourth energy sensor 44 may be any suitable sensor that is able to observe and measure energy of electromagnetic radiation in the ultraviolet region. In some embodiments, the first energy sensor 41, the second energy sensor 42, the third energy sensor 43 and the fourth energy sensor 44 are photodiodes. In other implementations, the first energy sensor 41, the second energy sensor 42, the third energy sensor 43 and the fourth energy sensor 44 are photomultiplier tubes.

The first energy sensor 41, the second energy sensor 42, the third energy sensor 43 and the fourth energy sensor 44 can be positioned at any suitable position to detect the energy or intensity of EUV light in the EUV radiation source 100. In one exemplary embodiment shown in FIG. 4A, the first energy sensor 41, the second energy sensor 42, the third energy sensor 43 and the fourth energy sensor 44 are arranged symmetric to the x-axis (i.e., the trajectory 119 of the target droplet).

Specifically, the first energy sensor 41 and the second energy sensor 42 are positioned at two opposite sides of the target droplet generator 115 and arranged symmetric to the x-axis. A connecting line C1 between the first energy sensor 41 and the excitation point 118 at which the target droplets DP1 being irradiated by the main pulse MP forms an included angle B1 with the x-axis. In one exemplary embodiment the included angle B1 is in a range from about 10 degrees to about 30 degrees. In another exemplary embodiment, the included angle B1 is about 20 degrees. In some embodiments, the connecting line C1 between the first energy sensor 41 and the excitation point 118 may be perpendicular to a light receiving surface 410 of the first energy sensor 41 that is used to receive the EUV light.

In addition, the third energy sensor 43 and the fourth energy sensor 44 are positioned at two opposite sides of the catcher 116 and arranged symmetric to the x-axis. A connecting line C2 between the third energy sensor 43 and the excitation point 118 at which the target droplets DP1 being irradiated by the main pulse MP forms an included angle B2 with the x-axis. In one exemplary embodiment the included angle B2 is in a range from about 10 degrees to about 30 degrees. In another exemplary embodiment, the included angle B2 is about 20 degrees. The included angle B2 may be greater than the included angle B1 because the excitation point 118 is located closer to the catcher 116 than the target droplet generator 115.

In some embodiments, the first energy sensor 41 and the second energy sensor 42 are cooperatively operated to detect a y-axis tilt of the target droplet DP1 in the excitation point 118. The y-axis tilt is defined as an included angle between a longitudinal axis of the target droplets DP1 and the y-axis. For example, as shown in scenario A in FIG. 4B, when OMY is about 0 (i.e., the pre-pulse PP heats the target droplet DP at its center), the resultant target droplet DP1 is oriented horizontally (its head and tail are at a normal position). In addition, as shown in scenario B in FIG. 4B, when OMY is greater than 0 (i.e., the pre-pulse PP heats the target droplet DP above its center), the resultant target droplet DP1 is oriented head-down and tail-up, and thus the y-axis tilt is greater than 0. Moreover, as shown in scenario C in FIG. 4B, when OMY is less than 0 (i.e., the pre-pulse PP heats the target droplet DP below its center), the resultant target droplet DP1 is oriented head-up and tail-down, and thus the y-axis tilt is less than 0. It will be appreciate that, the "up," "down," "above," and "below" as herein used are relative and are for the ease of description.

In one embodiment, when the y-axis tilt is greater than 0, the energy detected by the first energy sensor 41 is greater than the energy detected by the second energy sensor 42. On the other hand, when the y-axis tilt is less than 0, the energy detected by the first energy sensor 41 is less than the energy detected by the second energy sensor 42. As a result, the y-axis tilt of the target droplet DP1 is correlated with an energy ratio BiY21 of the first energy sensor 41 and the second energy sensor 42 which satisfies the following equation (1):

$$BiY21 = \frac{ES2 - ES1}{ES2 + ES1}, \qquad (1)$$

where the ES1 is an energy value detected by the first energy sensor, and ES2 is an energy value detected by the second energy sensor.

In some embodiments, in addition to the first energy sensor 41 and the second energy sensor 42, the third energy sensor 43 and the fourth energy sensor 44 are cooperatively operated to detect a y-axis tilt of the target droplet DP1 in the excitation point 118. The y-axis tilt of the target droplet DP1 is correlated with an energy ratio BiY43 of the third energy sensor 43 and the fourth energy sensor 44 which satisfies the following equation (2):

$$BiY43 = \frac{ES4 - ES3}{ES4 + ES3}, \qquad (2)$$

where ES3 is an energy value detected by the third energy sensor, and ES4 is an energy value detected by the fourth energy sensor.

Figure 5:
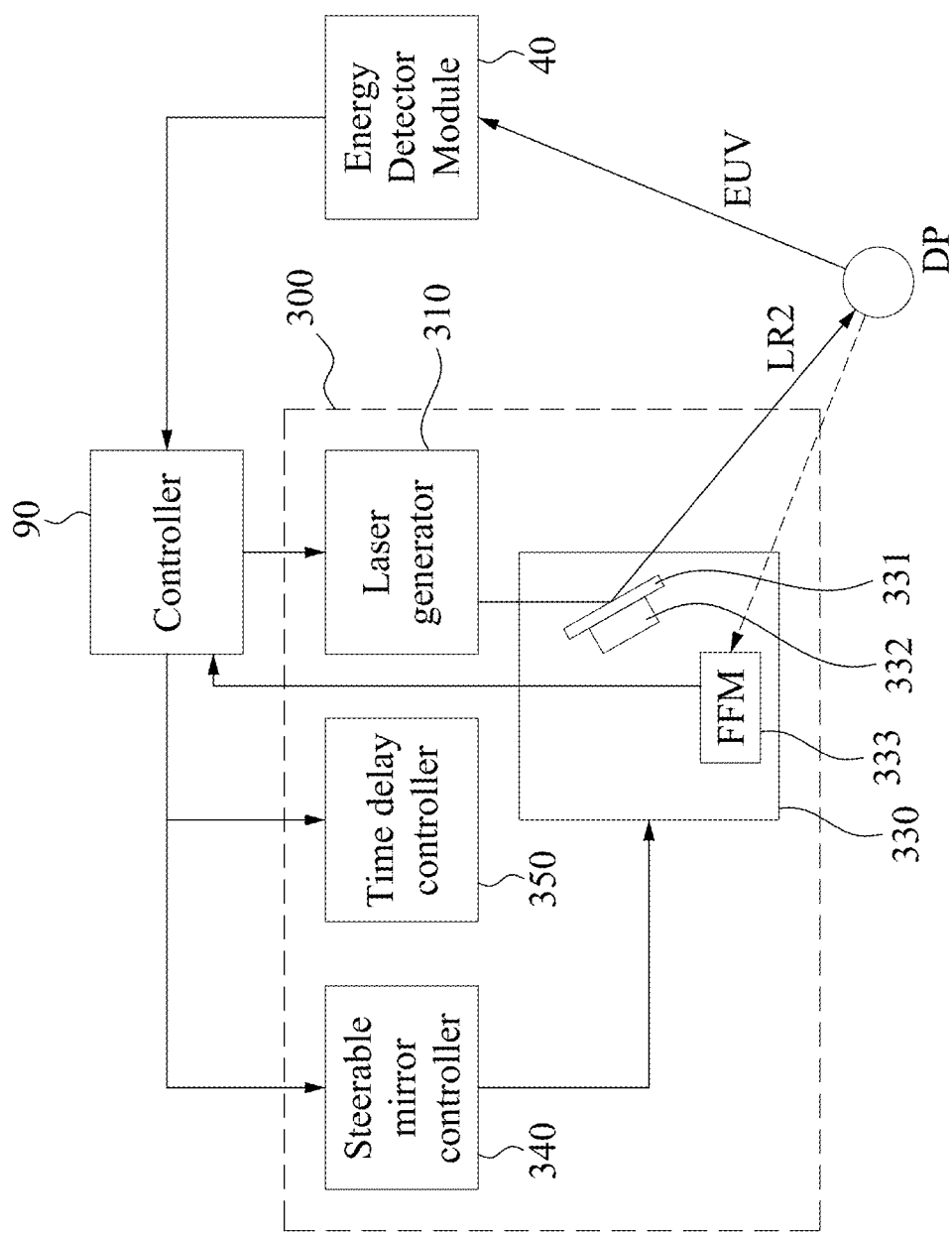
FIG. 5 illustrates a block diagram of an excitation laser module and related feedback mechanism, in accordance with some embodiments.

FIG. 5 shows a block diagram of the excitation laser module 300 and related feedback mechanism, in accordance with some embodiments. In some embodiments, a controller 90 is connected to a number of devices in the excitation laser module 300 so as to adjust at least one configurable parameter of the excitation laser module 300. In some embodiments, the controller 90 is electrically connected to the laser generator 310 to control energy of the pre-pulse PP and energy of the main pule MP of the excitation laser LR2. The energy of the pre-pulse PP and energy of the main pule MP can be adjusted by adjusting an power applied to a laser oscillator of the laser generator 310 which produces the pre-pulse PP or a laser oscillator of the laser generator 310 which produces of the main pule MP.

In some embodiments, the controller 90 is electrically connected to the energy sensor module 40 so as to receive signals transmitted form the energy sensor module 40 and adjusts at least one configurable parameter of the excitation laser module 300 based on the signals from the energy sensor module 40. For example, the controller controls parameter of OMY, time delay Td between the pre-pulse PP and the main-pulse MP, or energy of the pre-pulse PP based on either one of the energy ratio satisfied the equation (1) or equation (2).

Additionally, the controller 90 is electrically connected to a final focusing metrology (FFM) 333 in the focusing assembly 330, so as to receive signals transmitted form the FFM 333 and adjusts at least one configurable parameter of the excitation laser module 300 based on the signals from the FFM 333. In some embodiments, fractional portions of the pre-pulse PP and the main pulse MP may be reflected to the FFM 333 so that various metrology and diagnostic functions of the pre-pulse PP and the main pulse MP (e.g., the MPPP separation in x-axis, y-axis and z-axis) may be carried out. The FFM 333 may include a camera to monitor the pre-pulse PP and the main pulse MP. Alternatively, the FFM 333 includes a wave front sensor to measure the intensity and phase at various points in a wave front of the pre-pulse PP and the main pulse MP.

In some embodiments, the controller 90 is electrically connected to the steerable mirror controller 340 of the excitation laser module 300. The steerable mirror controller 340 controls the tilt angle of a steerable mirror 331. In some embodiments, the steerable mirror controller 340 is electrically connected to an actuator 332. The actuator 332 is used to control a movement of the steerable mirror 331 in at least one axis, for example 3 axes so as to change the angle of incidence at which the excitation laser LR2 is incident on the target droplet DP, thereby changing the amount of the excitation laser LR2 reflected and/or scattered by the target droplet DP into the energy sensor module 40). The steerable mirror 331 may be the last mirror in an optical path in the excitation laser module 300 before the excitation laser LR2 hits the target droplet DP. The actuator 332 may a piezoelectric actuator or any other suitable actuator.

In some embodiments, the controller 90 is electrically connected to the time delay controller 350 of the excitation laser module 300. The time delay controller 350 controls the time delay between the pre-pulse PP and the main-pulse MP. For example, when the controller 90 determines that the variation in energy measurement of light detected at energy sensor module 40 is lower than the acceptable range, the controller 90 controls the time delay controller 350 such that a shorter time delay is provided between the pre-pulse PP and the main-pulse MP, thereby allowing adequate exposure of the target droplet DP and increasing the detected variation in energy measurement.

Those of skill in the art will note that while the steerable mirror controller 340 and time delay controller 350 are depicted in the FIG. 5 as being separate from the laser generator 310, the steerable mirror controller 340 and the time delay controller 350 can be integrated with the laser generator 310 to form a single excitation laser module 300 in some embodiments. In such embodiments, the coupling between the controller 90 and the excitation laser module 300 can be suitably modified to effectuate the same result as disclosed herein.

Figure 6:
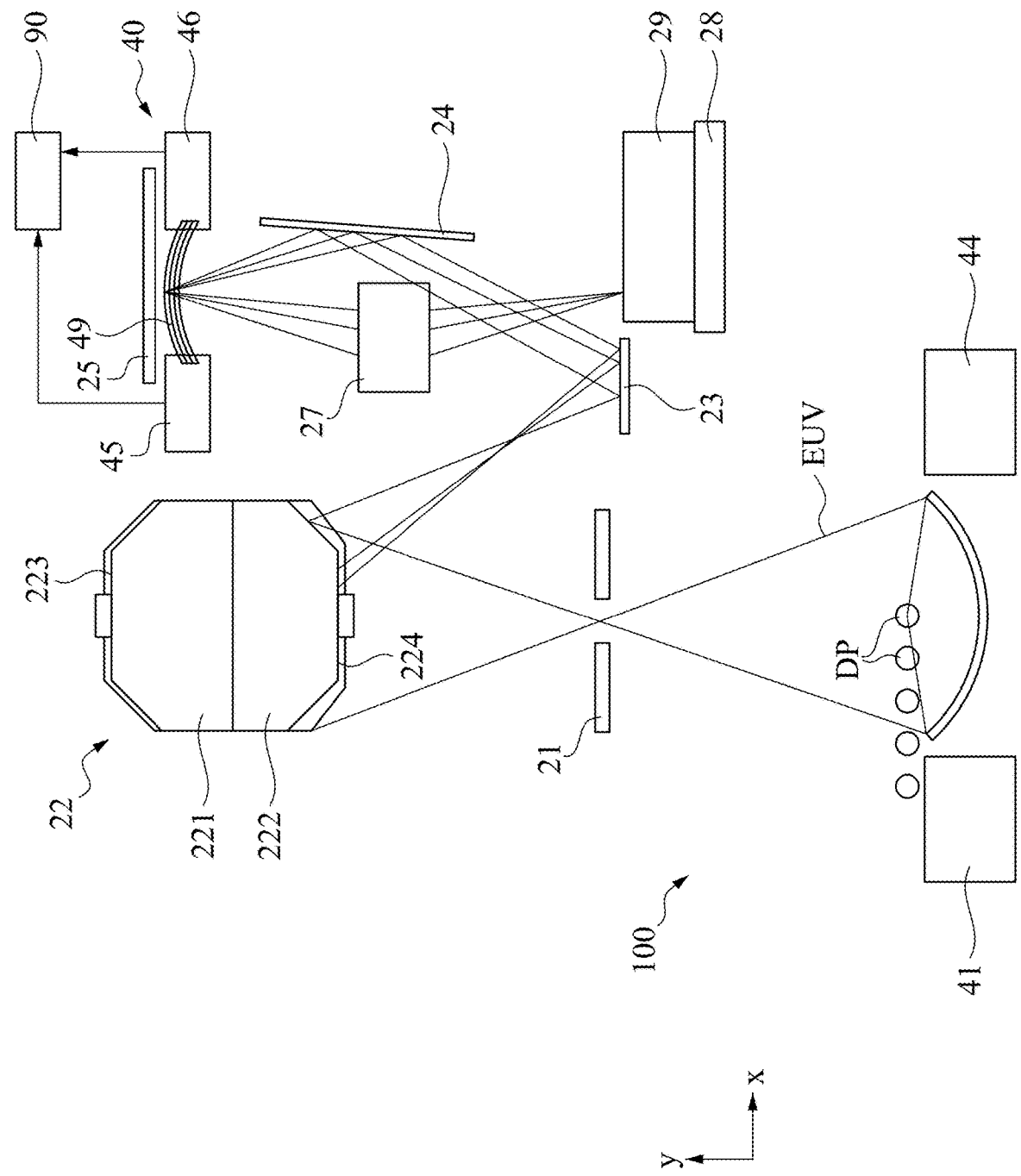
FIG. 6 illustrates a schematic diagram of partial elements in an EUV radiation source and an exposure tool, in accordance with some embodiments.

FIG. 6 illustrates a schematic diagram of partial elements in the EUV radiation source 100 and an exposure tool 200, in accordance with some embodiments. In some embodiments, the EUV radiation source 100 is configured to generate EUV radiation as a converging beam which passes through an intermediate focus 21 onto the field facet mirror 22. The field facet mirror 22 may include a number of reflective facets. Each facet is arranged to form the radiation into an arc-shape illumination slit when incident on the reticle 25. In some embodiments, the field facet mirror 22 has an upper portion 221 and a lower portion 222. The reflective facets are positioned at both upper portion 221 and the lower portion 222.

The radiation beam passes from the field facet mirror 22 to the pupil facet mirror 23, which comprises a plurality of concave reflective facets. Each concave facet is arranged to receive radiation reflected from a different facet of the field facet mirror 22. Therefore, the pupil facet mirror 23 has the same number of facets (or more) as the field facet mirror 22. The pupil facet mirror 23 is arranged to direct the radiation beam onto the reticle 25 through the delay mirror 24. A compensator device 49 is placed blow the reticle 25 to adjust the uniformity of the illumination slit. The compensator device 49 may include a number of fingers that are located at one side of the illumination slit and movable into and out of intersection with the illumination slit. In some other embodiments, two compensator devices 49 are located at both sides of the illumination slit to control the uniformity of the illumination slit.

In some embodiment, the energy sensor module 40 further includes a number of energy sensors, such as first external sensor 45 and second external sensor 46 positioned on the compensator device 49. The first external sensor 45 and the second external sensor 46 are used to detect energy of two ends of the illumination slit in a length direction, and the movement of each finger of the compensator device 49 is controlled according to the energy detected by the first external sensor 45 and the second external sensor 46. In some embodiments, the first external sensor 45 and the second external sensor 46 are electrically connected to the controller 90, and the configurable parameter of the excitation laser module 300 is controlled according to the signals produced by the first external sensor 45 and the second external sensor 46. The first external sensor 45 and the second external sensor 46 may be photodiodes.

The radiation beam having the patterned image is reflected by the reticle 25 and projected on the semiconductor wafer 28 through a projection optics module (or projection optics box (POB)) 27. In some embodiments, a slit sensor 29 is positioned, for example, on a wafer table by which the semiconductor wafer 28 is held. The slit sensor 29 is configured to detect energy of the radiation beam projected on the semiconductor wafer 28. The slit sensor 29 may be a photodiode.

Figure 4B:
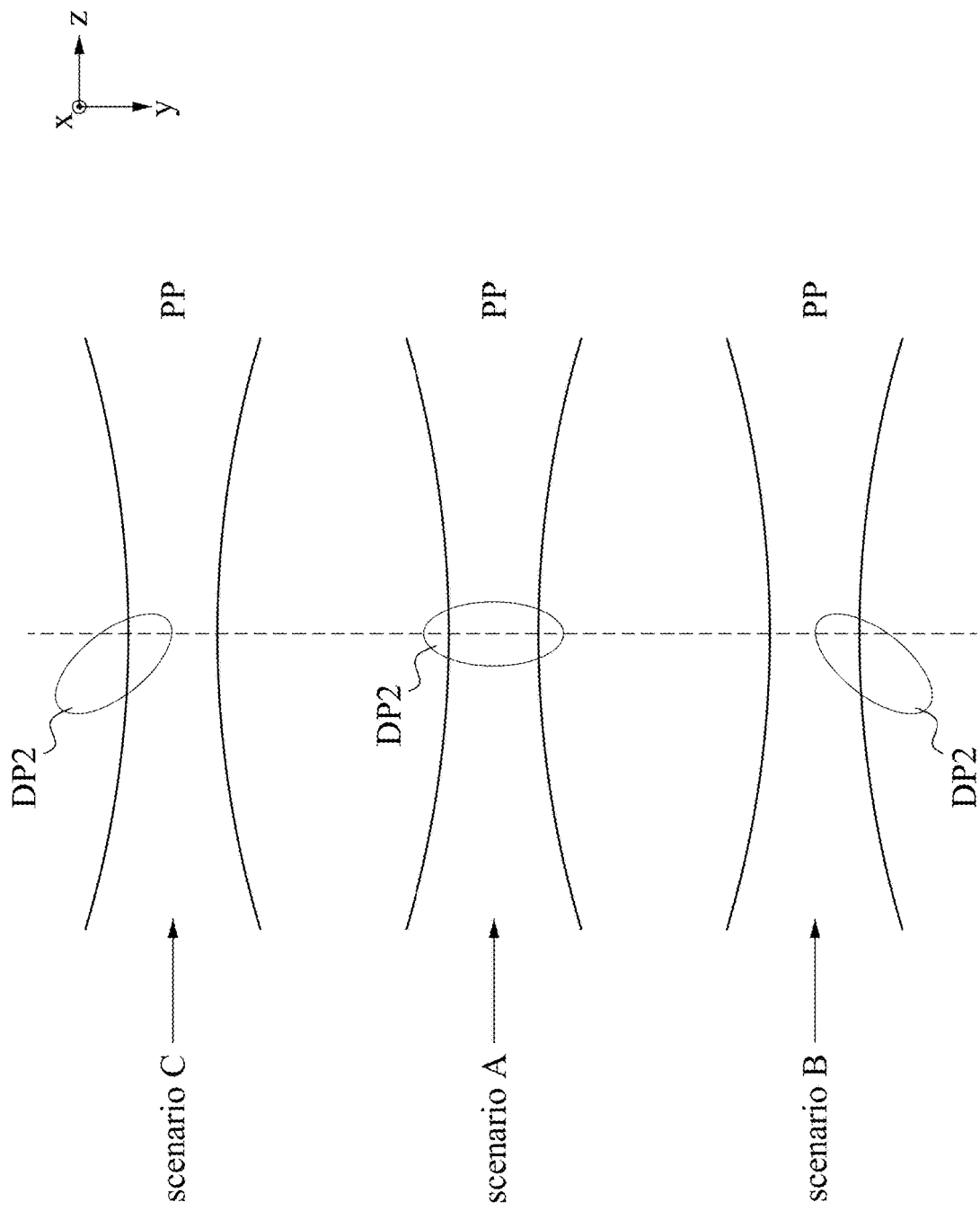
FIG. 4B illustrates a pre-pulse laser hitting different excitation positions of target droplets, which may be configured in the EUV radiation source of FIG. 4A.

In some embodiments, the first external sensor 45 receives radiation beam from facets of the field facet mirror 22 that are located at an upper end 223 of the upper portion 221. In addition, the second external sensor 46 receives radiation beam from facets of the field facet mirror 22 that are located at a lower end 224 of the lower portion 222. The upper end 223 and the lower end 224 are arranged along the y-axis. Therefore, when a y-axis tilt of the target droplet DP1 occurs, as shown in FIG. 4B, the upper and lower energy distribution on the upper portion 221 and the lower portion 222 changes from 50%-50% to 49%-51%, which introduces about 0.35% measurement difference between the first external sensor 45 and the second external sensor 46.

In some embodiments, a ratio of the energy value detected by the slit sensor 29 and energy value detected by one of the first external sensor 45 and the second external sensor 46 is used to compensate a mechanical and/or electrical drift in the EUV radiation source 100 by correction device, such as compensator device 49 so as to improve dose performance on the semiconductor wafer 28. However, if a slit uniformity of the illumination slit is decayed significantly (i.e., a difference exists between the energy detected by the first external sensor 45 and the second external sensor 46), an error may occur because the compensator device 49 may compensate the drift according to the drifted value from one of the first external sensor 45 and the second external sensor 46. Therefore, reducing or eliminating the y-axis tilt of the target droplet DP1 is desired so as to maintain dose performance and slit uniformity on the reticle 25.

To address the problem mentioned above, a method S50 for controlling an extreme ultraviolet (EUV) radiation in lithography system is provided below, in accordance with some embodiments.

Figure 7:
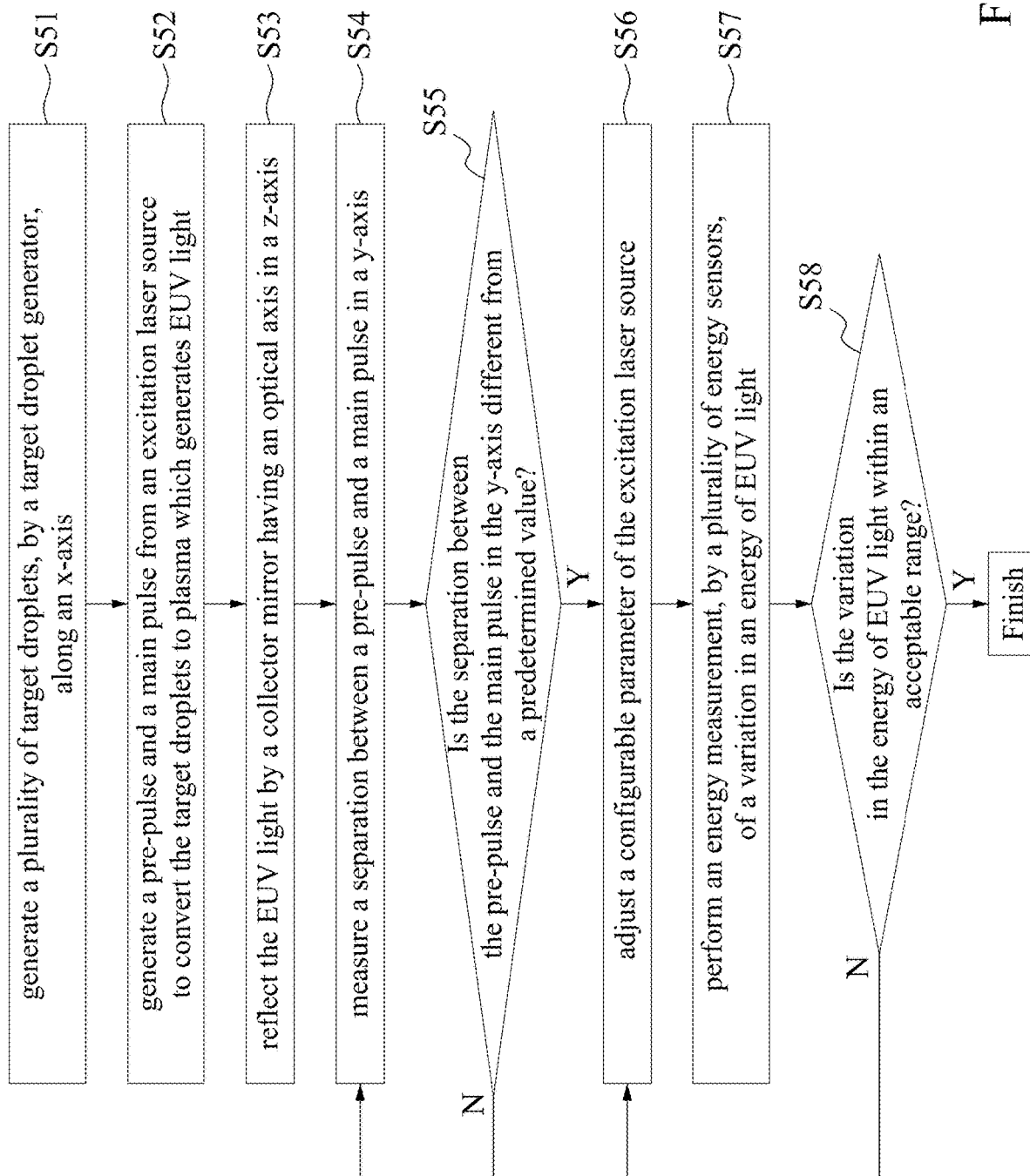
FIG. 7 illustrates a flow-chart of a method of controlling the excitation laser/energy sensor system of an EUV source, in accordance with an embodiment of the present disclosure.

FIG. 7 is a flow chart of a method S50 for performing a lithography process in semiconductor fabrication, in accordance with some embodiments of the present disclosure. Although the method S50 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included. It will be appreciated that other figures are used as examples for the method, but the method is also applicable to other structures and/or configurations.

The method S50 includes operation S51, in which a number of target droplets DP are generated from the target droplet generator 115 along the x-axis. In some embodiments, as shown in FIG. 4A, the target droplets DP are projected from the target droplet generator 115 and toward the catcher 116 along the trajectory 119. In some embodiments, the target droplets 32 are tin (Sn) droplets. In an embodiment, the target droplets 32 each have a diameter about 30 microns (μm). In an embodiment, the target droplets DP are generated at a rate about 50 kilohertz (kHz) and are introduced into the excitation point 118 at a speed about 70 meters per second (m/s). Other material can also be used for the target droplets DP, for example, a tin containing liquid material such as eutectic alloy containing tin, lithium (Li), and xenon (Xe). The target droplets DP may be in a solid or liquid phase.

The method S50 also includes operation S52, in which the pre-pulse PP and the main pulse MP from the excitation laser module 300 is generated to convert the target droplets DP to plasma which generates EUV light. The method S50 also includes operation S53, in which, the EUV light is reflected by the collector mirror 110. In some embodiments, the pre-pulse PP hits target droplets DP to deform the target droplets DP into target droplet DP1 which has an extended size. The target droplet DP1 may form a tilt angle relative to y-axis when a mechanical and/or electrical drift in the excitation laser module 300, as shown in FIG. 4B. The y-axis tilt of the target droplet DP1 may cause a decrease in slit uniformity of the illumination slit projected on the reticle 25 (see FIG. 6) which in turns causes a dose error on the semiconductor. In addition, debris 112 (see FIG. 1) of the target droplet DP1 may contaminate the collector mirror 110. In order to address the problems, the method S50 continues operations S54-S56.

In operation S54, the separation between the pre-pulse PP and the main pulse MP is measured. In some embodiments, a shift in a distance along the y-axis of the MPPP separation (i.e., Sep_y) is measured by the FFM 333 of the focusing assembly 330. In some other embodiments, the separation Sep_y is measured by analyzing an image in relation to the target droplets DP and droplet DP1 which produced by a camera position in the EUV radiation source 100.

Figure 8:
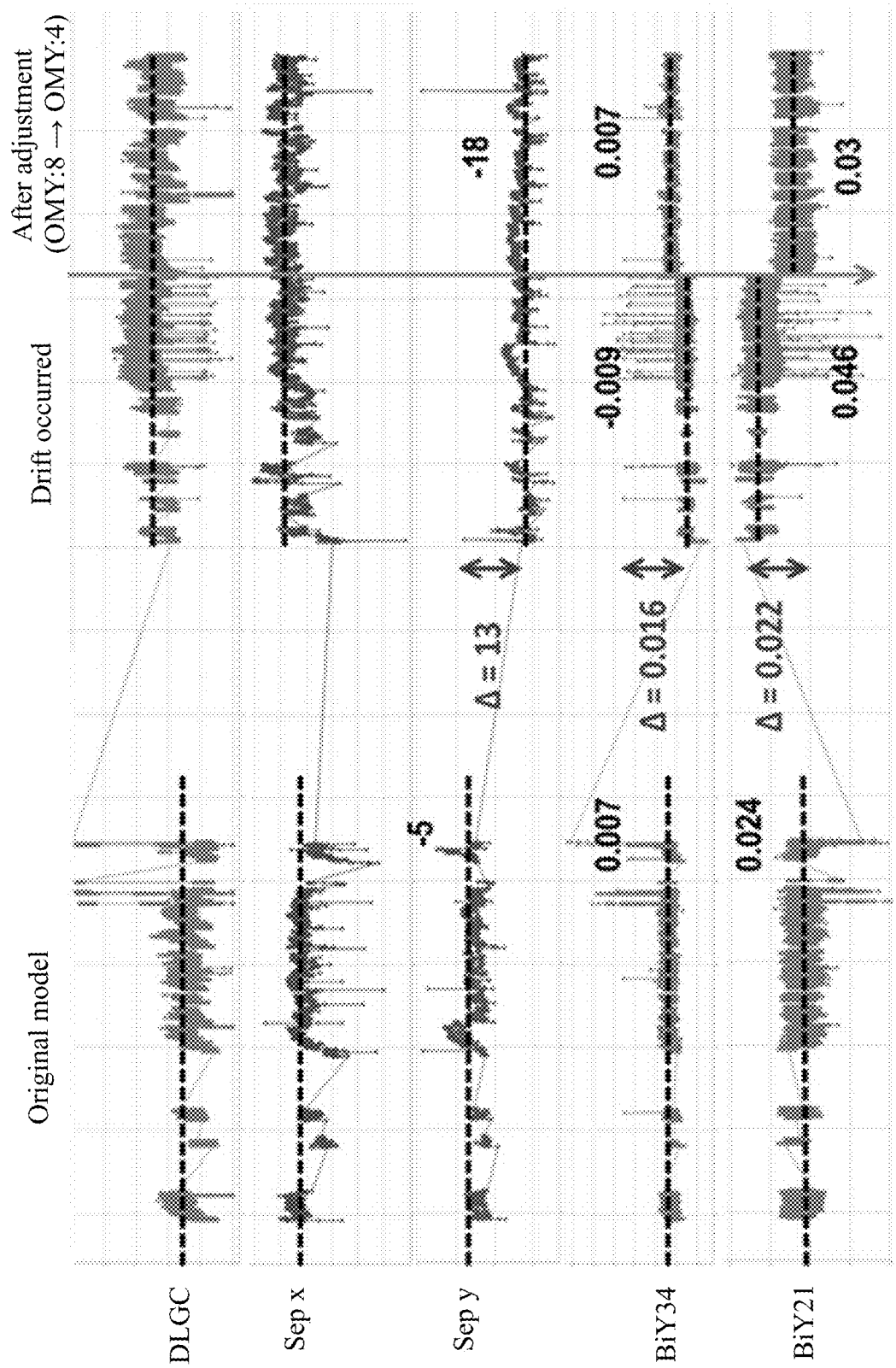
FIG. 8 is a plot indicating a number of measurement result in an EUV radiation source, in accordance with an embodiment of the present disclosure.

In operation S55, the data of the measurements are transmitted to the controller 90 to compare with a predetermined value to determine if a change in the separation Sep_y occurs. In some embodiments, the separation Sep_y changes over time due to various factors such as, for example, mechanical and/or electrical drift in the EUV radiation source 100, instability of the target droplet generator, and changes in chamber environment. Therefore, as shown in FIG. 8, the separation Sep_y is shifted from a predetermined value of −5 to −18. The shift of the separation Sep_y causes a change in the energy ratio BiY21 by about 0.016. In addition, the shift of the separation Sep_y leads to a change in the energy ratio BiY34 about by about 0.022, according to a simulation result. In some embodiments, in addition to the shift of the separation Sep_y, a shift in a distance along the x-axis of the MPPP separation (i.e., Sep_x) takes place, as shown in FIG. 8, which can be measured by the FFM 333 as well.

Figure 9:
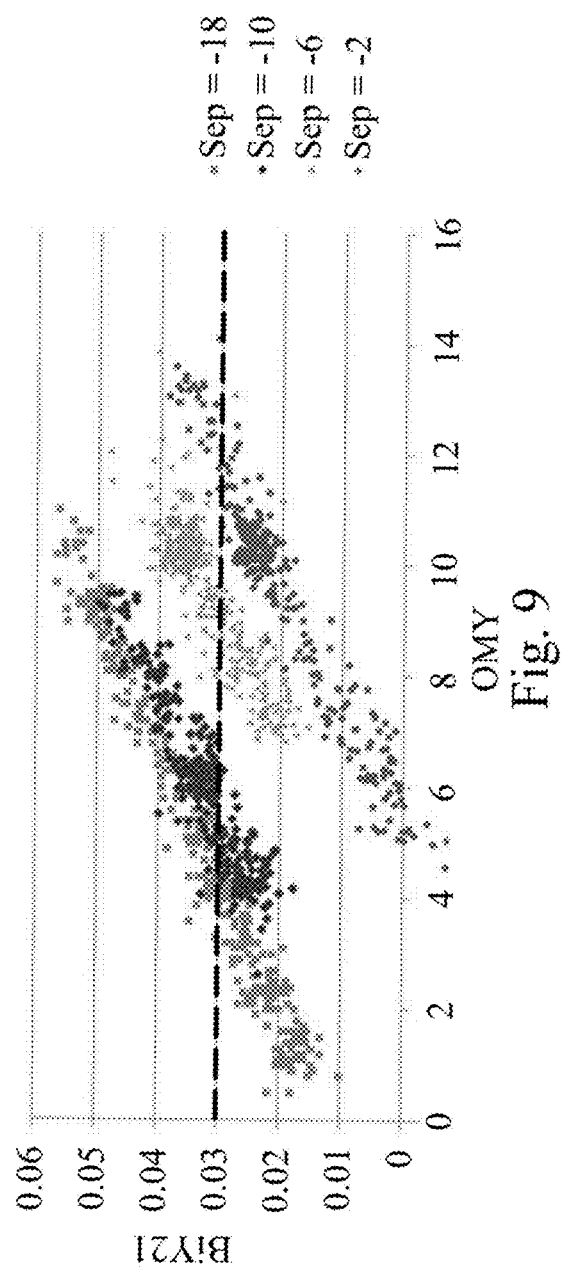
FIG. 9 schematically illustrates simulation results of energy ratios when different distances in y-axis between pre-pulse and target droplet is controlled based on different separation of laser pulses, in accordance with some embodiments of the present disclosure.
Figure 10:
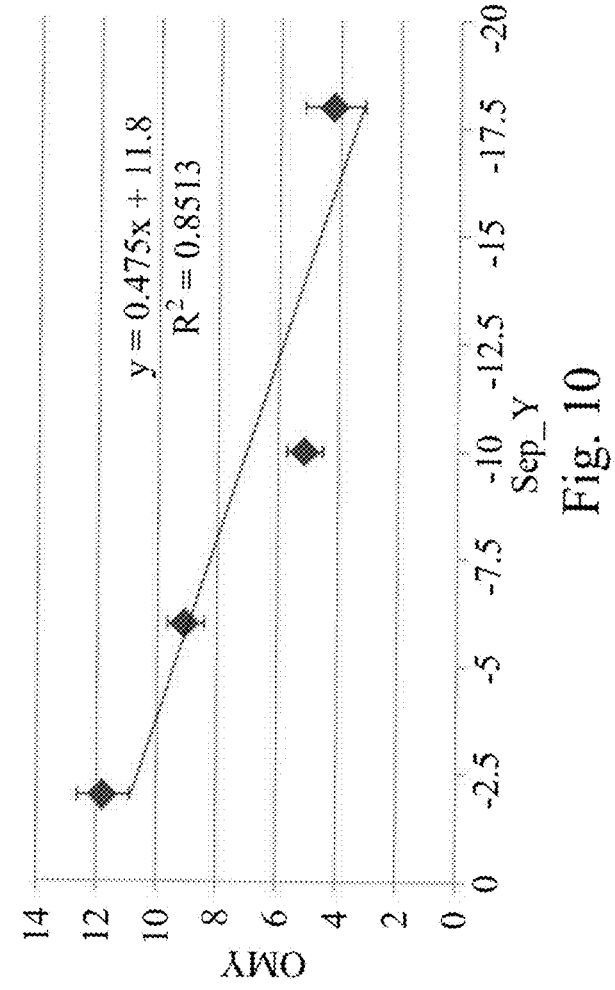
FIG. 10 illustrates a plot of a relationship between separation of pre-pulse and main pulse and distance between pre-pulse and target droplet as energy ratio is kept in 0.03, in accordance with some embodiments of the present disclosure.

In operation S56, the configurable parameter of the excitation laser module 300 is adjusted to return the energy ratio to the value set in the original model. In some embodiments, a distance in the y-axis between the target droplet and the focal point of the pre-pulse PP (OMY) is adjusted based on a linear equation stored in the controller 90. In some embodiments, a linear relationship between separation Sep_y and OMY when BiY21 is 0.03 can be interpreted by analyzing the plot shown in FIG. 9, and an adjustment in OMY can be obtained by putting the separation Sep_y measured in operation S54 into the linear equation shown in FIG. 10. For example, in cases where the measured Sep_y is −18, the calculated result is about 4. Therefore, by adjusting the OMY from 8 to 4, the energy ratio BiY21 returns to a value approaching to the original model, as shown in FIG. 8. In an alternative embodiment, a linear equation in related to the energy ration BiY43 can be interpreted, and the OMY is adjusted according the linear equation. In yet one another embodiment, a linear equation in related to the energy ration BiY21 and a linear equation in related to the energy ration BiY43 are both interpreted, and the OMY is adjusted according to both linear equations.

In some embodiments, the adjustment of the OMY is performed by changing a tilt angle of the steerable mirror 331 of the excitation laser module 300, in according with some embodiments. Therefore, as shown in FIG. 8, after the adjustment in OMY, the separation Sep_x and the separation Sep_y are not adjusted to the original model, this is because the direction of the pre-pulse PP and the main pulse MP is adjusted by the steerable mirror 331 simultaneously. However, it will be appreciated that many variations and modifications can be made to embodiments of the disclosure. In other embodiments, the Sep_x and the separation Sep_y may be varied after the adjustment in cases where tilt angles of the pre-pulse PP and the main pulse MP are adjusted by different steerable mirrors.

In some embodiments, the method S50 further includes operation S57, in which an energy measurement of a variation in the energy of EUV light is performed by a number of energy sensors, such as first energy sensor 41, second energy sensor 42, third energy sensor 43, fourth energy sensor 44, first external sensor 45 and second external sensor 46. The data in relation to the variation of energy measurement of the EUV light is transmitted to the controller 90.

Figure 11:
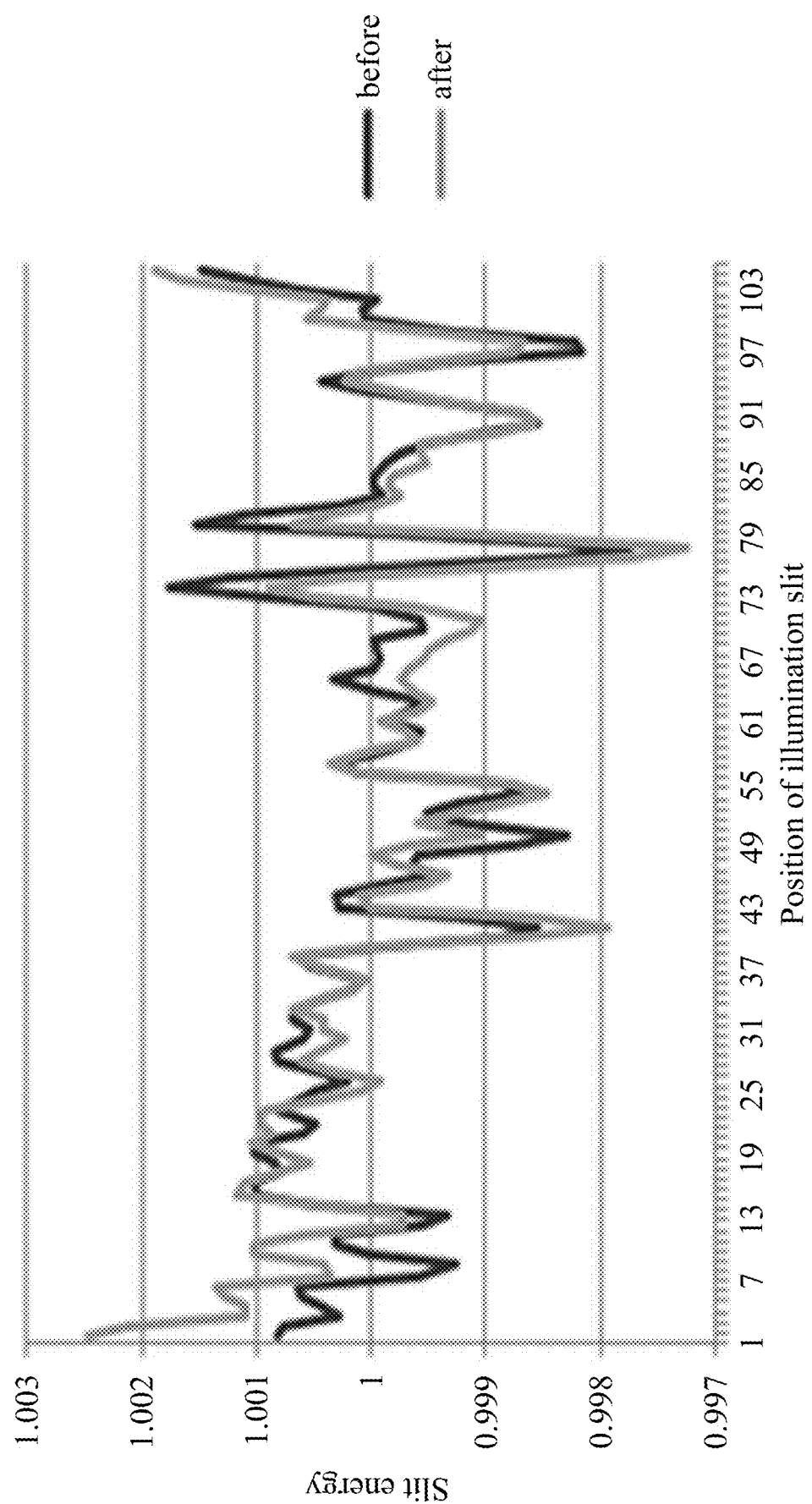
FIG. 11 illustrates a plot of a uniformity profile of illumination slit before and after adjustment of y-axis tilt of target droplets, in accordance with some embodiments of the present disclosure.

In some embodiments, after the adjustment of the y-axis tilt of the target droplets, the uniformity of the illumination slit on the reticle is improved, as shown in FIG. 11. In some embodiments, after the adjustment of the y-axis tilt of the target droplets, the energy of the illumination slit detected by the first external sensor 45 is the same at the energy of the illumination slit detected by the second external sensor 46. In some other embodiments, after the adjustment of the y-axis tilt of the target droplets, the energy of the illumination slit detected by the first external sensor 45 is slight different from the energy of the illumination slit detected by the second external sensor 46. According to one simulation results, a ratio between an energy measurement produced by the first external sensor 45 to an energy measurement produced by the second external sensor 46 is improved from 0.5 to 0.85.

In some embodiments, operation S56 is conducted based on in-line energy measurement of the EUV light rather than the calculation results as mentioned above. In one exemplary embodiment, the data in relation to the variation of energy measurement of the EUV light is analyzed to determine if the variation of energy measurement of the EUV light is in an acceptable range (operation S58). The acceptable range is, for example, one standard deviation or two standard deviations less than or greater than the energy ratio in the original model shown in FIG. 8. The controller 90 continuously adjusts the configurable parameters of the excitation laser module 300 and will not stop the adjustment until the controller 90 detects the variation of energy measurement of the EUV light is in the acceptable range.

In some embodiments, the original model of the parameters shown in FIG. 8 is determined by analyzing the dose error on the semiconductor wafer. Specifically, SEM images of features on the semiconductor wafer after exposure of EUV light is analyzed to acquire information about incident EUV light on different locations. By matching the information about incident EUV light and the defects of the features, adjustment information of the parameters, which can efficiently reduce dose error on the semiconductor wafer, is determined and is set as model (i.e., the predetermine value in operation S55 and acceptable range in operation S58) for next semiconductor wafer processed by the lithography system.

Alternatively, the original model of the parameters shown in FIG. 8 is determined by analyzing the degradation of the collector mirror 110. Specifically, images of the collector mirror 110 after generation of EUV light is analyzed to acquire information about a map of debris 112 accumulated on the collector mirror 110. A tilt angle of the target droplet DP1 can be derived by the map of debris 112. Based on the tilt angle of the target droplet DP1, adjustment information of the parameters, which can efficiently reduce debris contamination, is determined and is set as model (i.e., the predetermine value in operation S55 and acceptable range in operation S58) for next semiconductor wafer processed by the lithography system.

FIG. 12 shows a block diagram of a controller module, in accordance with some embodiments. The controller 90 generates output control signals for controlling operations of the EUV radiation source 100, the exposure tool 200 and the excitation laser module 300 and other components of the EUV radiation source 100, the exposure tool 200 and the excitation laser module 300, in accordance with some embodiments. In some embodiments, the controller 90 includes a processor 94, an input/output (I/O) device 92, a memory 96, and a network interface 98 each communicatively coupled via an interconnection communication mechanism.

The processor 94 is arranged to execute and/or interpret one or more set of instructions 97 stored in the memory 96. In some embodiments, the processor 94 is a central processing unit (CPU), a multi-processor, a distributed processing system, an application specific integrated circuit (ASIC), and/or a suitable processing unit. The processor 94 may utilize the logic of proportional-integral-derivative (DIP) to determine an inclined angle of the optic assembly, such as the steerable mirror 331.

The I/O device 92 is coupled to external circuitry. In some embodiments, the I/O device 92 includes a keyboard, keypad, mouse, trackball, trackpad, and/or cursor direction keys for communicating information and commands to the processor 94.

The memory 96 (also referred to as a computer-readable medium) includes a random access memory or other dynamic storage device, communicatively coupled to the bus for storing data and/or instructions for execution by the processor 94. In some embodiments, the memory 96 is used for storing temporary variables or other intermediate information during execution of instructions to be executed by the processor 94. In some embodiments, the memory 96 also includes a read-only memory or other static storage device coupled to the bus for storing static information and instructions for the processor 94. In some embodiments, the memory 96 is an electronic, magnetic, optical, electromagnetic, infrared, and/or a semiconductor system (or apparatus or device). For example, the memory 96 includes a semiconductor or solid-state memory, a magnetic tape, a removable computer diskette, a random access memory (RAM), a read-only memory (ROM), a rigid magnetic disk, and/or an optical disk. In some embodiments using optical disks, the memory 96 includes a compact disk-read only memory (CD-ROM), a compact disk-read/write (CD-R/W), and/or a digital video disc (DVD). The memory 96 may store information in relation to the historical data of the optic assembly of the lithography system 10.

The memory 96 is encoded with, i.e., storing, the computer program code, i.e., a set of executable instructions 97, for controlling one or more components of the EUV radiation source 100, the exposure tool 200 and the excitation laser module 300 to perform the method S50. In some embodiments, the memory 96 also stores information for performing the method S50 as well as information generated during performing the method S50.

The network interface 98 includes a mechanism for connecting to a network 99, to which one or more other computer systems are connected. In some embodiments, the network interface 98 includes a wired and/or wireless connection mechanism. The network interface 98 includes wireless network interfaces such as BLUETOOTH, WIFI, WIMAX, GPRS, or WCDMA; or wired network interface such as ETHERNET, USB, or IEEE-1394. In some embodiments, the controller 90 is coupled with one or more components of the EUV radiation source 100, the exposure tool 200 and the excitation laser module 300 via the network interface 98. In some embodiments, the controller 90 is directly coupled with one or more components of the EUV radiation source 100, the exposure tool 200 and the excitation laser module 300, e.g., with the components coupled to the bus instead of via the network interface 98.

Based on the above discussions, it can be seen that the present disclosure offers following advantages. It is understood, however, that other embodiments may offer additional advantages, and not all advantages are necessarily disclosed herein, and that no particular advantage is required for all embodiments.

Embodiments of the present disclosure provide a method for controlling EUV light by adjusting a y-axis tilt of the target droplets based on a real-time measured information, such as EUV light energy or variation in distance between pre-pulse and main pulse. Therefore, a slit uniformity of the illumination slit on reticle is improved, and a concern of a measurement error on scanner energy sensors because of a source far field fluctuation is mitigated. In addition, since the inaccuracy of the scanner energy sensors is avoided, the dose error on the semiconductor wafer can be compensated correctly with the variation collected by the scanner energy sensors. Moreover, since the target droplets are excited properly, contamination of the collector mirror is prevented, and the reflectivity of the collector mirror is improved.

The advanced lithography process, method, and materials described above can be used in many applications, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure.

In accordance with some embodiments, a method of controlling an extreme ultraviolet (EUV) radiation in lithography system is provided. The method includes generating a plurality of target droplets, by a target droplet generator, along an x-axis. The method also includes generating a pre-pulse and a main pulse from an excitation laser module to convert the target droplets to plasma which generates EUV light and reflecting the EUV light by a collector mirror having an optical axis in a z-axis. The method further includes measuring a separation between a pre-pulse and a main pulse in a y-axis. The y-axis is perpendicular to the x-axis and the z-axis. In addition, the method includes performing an energy measurement, by a plurality of energy sensors, of a variation in an energy of EUV light. Moreover, the method includes determining whether the separation between the pre-pulse and the main pulse in the y-axis is changed. In response to the separation between the pre-pulse and the main pulse in the y-axis is changed, adjusting a configurable parameter of the excitation laser module to set the variation in the energy of the EUV light within an acceptable range. In some embodiments, the separation between the pre-pulse and the main pulse in the y-axis is maintained regarding the adjustment of the configurable parameter of the excitation laser module. In some embodiments, a separation between the pre-pulse and the main pulse in the x-axis is maintained regarding the adjustment of the configurable parameter of the excitation laser module. In some embodiments, the adjusting the configurable parameter of the excitation laser module is performed by changing an angle of a steerable mirror coupled to the excitation laser module. In some embodiments, the change in the angle of the steerable mirror coupled to the radiation source varies a distance in the y-axis between one of the target droplets and a focal point of the pre-pulse. In some embodiments, the adjusting the configurable parameter of the excitation laser module is performed by changing an energy of the pre-pulse. In some embodiments, the adjusting the configurable parameter of the excitation laser module is performed by changing a time delay between the pre-pulse and the main pulse. In some embodiments, the energy measurement is performed by two energy sensors that are arranged symmetric with the x-axis. In some embodiments, the method further includes adjusting a slit uniformity of the EUV light by a compensator device. The energy measurement is performed by two energy sensors that are positioned on the compensator device.

In accordance with some other embodiments, a method of controlling an extreme ultraviolet (EUV) radiation in lithography system is provided. The method includes generating a plurality of target droplets, by a target droplet generator, along an x-axis. The method includes generating a pre-pulse and a main pulse from an excitation laser module to convert the target droplets to plasma which generates EUV light. The method includes performing an energy measurement, by a first energy sensor and a second energy sensor that are arranged symmetric with the x-axis and located adjacent to the target droplet generator, of the EUV light. In addition, the method includes calculating a first energy ratio BiY21 according to the following equation $$BiY21 = \frac{ES2 - ES1}{ES2 + ES1},$$

where ES1 is an energy value detected by the first energy sensor, and ES2 is an energy value detected by the second energy sensor. The method further includes determining whether the first energy ratio is within a first acceptable range. In response to the first energy ratio is out of the first acceptable range, adjusting a configurable parameter of the excitation laser module to set the first energy ratio within the first acceptable range. In some embodiments, the method further includes performing another energy measurement, by a third energy sensor and a fourth energy sensor that are arranged symmetric with the x-axis and located away from the target droplet generator, of the EUV light generated when the target droplets are converted to plasma; calculating a second energy ratio BiY43 according to the following equation:

$$BiY43 = \frac{ES4 - ES3}{ES4 + ES3},$$

where ES3 is an energy value detected by the third energy sensor, and ES4 is an energy value detected by the fourth energy sensor; determining whether the second energy ratio is within a second acceptable range; and in response to the second energy ratio is out of the second acceptable range, adjusting a configurable parameter of the excitation laser module to set the second energy ratio within the second acceptable range. In some embodiments, the adjusting the configurable parameter of the excitation laser module is performed by changing an angle of a steerable mirror coupled to the radiation source. In some embodiments, the change in the angle of the steerable mirror coupled to the radiation source varies a distance between one of the target droplets and a focal point of the pre-pulse. In some embodiments, wherein the adjusting the configurable parameter of the excitation laser module is performed by changing an energy of the pre-pulse. In some embodiments, wherein the adjusting the configurable parameter of the excitation laser module is performed by changing a time delay between the pre-pulse and the main-pulse. In some embodiments, wherein the EUV light is guided to expose a substrate, and the method further comprises: acquiring a dose performance data by analyzing features on the substrate after the exposure of the EUV light; and determining the first acceptable range of the energy measurement based on the dose performance data. In some embodiments, the method further includes reflecting the EUV light through a collector mirror; acquiring a collector mirror degradation data by analyzing locations on the collector mirror where debris of the target droplets are accumulated; and determining the first acceptable range of the energy measurement based on the collector mirror degradation data.

In accordance with yet another embodiments, an apparatus for generating extreme ultraviolet (EUV) radiation is provided. The apparatus includes a droplet generator configured to generate target droplets along an x-axis. The apparatus also includes an excitation laser module configured to generate a pre-pulse and a main pulse to convert the target droplets to plasma which generates EUV light. The apparatus further includes a collector mirror configured to reflect the EUV light and having an optical axis in a z-axis. In addition, the apparatus includes a first energy sensor and a second energy sensor configured to measure a variation in energy of the EUV light. The apparatus further includes a controller coupled to the first energy sensor, the second energy sensor and the final focus module and programmed to: determine whether the separation between the pre-pulse and the main pulse in the y-axis is different from a predetermined value; and adjust, in response to a determination that the separation between the pre-pulse and the main pulse in the y-axis is different from the predetermined value, a configurable parameter of the excitation laser module to set the within an acceptable range. In some embodiments, the excitation laser module comprises a steerable mirror configured to control a focal point of one of or both the pre-pulse and the main pulse, and the controller is configured to control the steerable mirror to change the focal point of one of or both the pre-pulse and the main pulse based on the separation between the pre-pulse and the main pulse in the y-axis. In some embodiments, the steerable mirror is a last mirror in an optical path before the pre-pulse or the main pulse hit one of the target droplets.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of controlling an extreme ultraviolet (EUV) radiation in lithography system, comprising:
generating a plurality of target droplets, by a target droplet generator, along an x-axis;
generating a pre-pulse and a main pulse from an excitation laser module to convert the target droplets to plasma which generates EUV light;
reflecting the EUV light by a collector mirror having an optical axis along a z-axis;
measuring a separation between a pre-pulse and a main pulse along a y-axis, wherein the y-axis is perpendicular to the x-axis and the z-axis;
performing an energy measurement, by a plurality of energy sensors, of a variation in an energy of EUV light;
determining whether the separation between the pre-pulse and the main pulse along the y-axis is changed; and
in response to a determination that the separation between the pre-pulse and the main pulse along the y-axis is changed, adjusting a configurable parameter of the excitation laser module to set the variation in the energy of the EUV light within an acceptable range.

2. The method of claim 1, wherein the adjustment of the configurable parameter of the excitation laser module comprises maintaining a desired separation between the pre-pulse and the main pulse along the y-axis.

3. The method of claim 1, wherein the adjustment of the configurable parameter of the excitation laser module comprises maintaining a desired separation between the pre-pulse and the main pulse along the x-axis.

4. The method of claim 1, wherein the adjusting the configurable parameter of the excitation laser module is performed by changing an angle of a steerable mirror coupled to the excitation laser module.

5. The method of claim 4, wherein the change in the angle of the steerable mirror coupled to the radiation source varies a distance along the y-axis between one of the target droplets and a focal point of the pre-pulse.

6. The method of claim 1, wherein the adjusting the configurable parameter of the excitation laser module is performed by changing an energy of the pre-pulse.

7. The method of claim 1, wherein the adjusting the configurable parameter of the excitation laser module is performed by changing a time delay between the pre-pulse and the main pulse.

8. The method of claim 1, wherein the energy measurement is performed by two energy sensors that are arranged symmetric with the x-axis.

9. The method of claim 1, further comprising:
adjusting a slit uniformity of the EUV light by a compensator device;
wherein the energy measurement is performed by two energy sensors that are positioned on the compensator device.

10. A method of controlling an extreme ultraviolet (EUV) radiation in lithography system, comprising:
generating a plurality of target droplets, by a target droplet generator, along an x-axis;
generating a pre-pulse and a main pulse from an excitation laser module to convert the target droplets to plasma which generates EUV light;
performing an energy measurement, by a first energy sensor and a second energy sensor that are arranged symmetric with the x-axis and located adjacent to the target droplet generator, of the EUV light;
calculating a first energy ratio BiY21 according to the following equation:

$$BiY21 = \frac{ES2 - ES1}{ES2 + ES1},$$

where ES1 is an energy value detected by the first energy sensor, and ES2 is an energy value detected by the second energy sensor;

determining whether the first energy ratio is within a first acceptable range; and in response to a determination that the first energy ratio is out of the first acceptable range, adjusting a configurable parameter of the excitation laser module to set the first energy ratio within the first acceptable range.

11. The method of claim 10, further comprising:

performing another energy measurement, by a third energy sensor and a fourth energy sensor that are arranged symmetric with the x-axis and located away from the target droplet generator, of the EUV light generated when the target droplets are converted to plasma;

calculating a second energy ratio BiY43 according to the following equation:

$$BiY43 = \frac{ES4 - ES3}{ES4 + ES3},$$

where ES3 is an energy value detected by the third energy sensor, and ES4 is an energy value detected by the fourth energy sensor;

determining whether the second energy ratio is within a second acceptable range; and in response to a determination that the second energy ratio is out of the second acceptable range, adjusting a configurable parameter of the excitation laser module to set the second energy ratio within the second acceptable range.

12. The method of claim 10, wherein the adjusting the configurable parameter of the excitation laser module is performed by changing an angle of a steerable mirror coupled to the radiation source.

13. The method of claim 12, wherein the change in the angle of the steerable mirror coupled to the radiation source varies a distance between one of the target droplets and a focal point of the pre-pulse.

14. The method of claim 10, wherein the adjusting the configurable parameter of the excitation laser module is performed by changing an energy of the pre-pulse.

15. The method of claim 10, wherein the adjusting the configurable parameter of the excitation laser module is performed by changing a time delay between the pre-pulse and the main-pulse.

16. The method of claim 10, wherein the EUV light is guided to expose a substrate, and the method further comprises:

acquiring a dose performance data by analyzing features on the substrate after the exposure of the EUV light; and determining the first acceptable range of the energy measurement based on the dose performance data.

17. The method of claim 10, further comprising:

reflecting the EUV light through a collector mirror;

acquiring a collector mirror degradation data by analyzing locations on the collector mirror where debris of the target droplets are accumulated; and determining the first acceptable range of the energy measurement based on the collector mirror degradation data.

18. An apparatus for generating extreme ultraviolet (EUV) radiation comprising:

a droplet generator configured to generate target droplets along an x-axis;

an excitation laser module configured to generate a pre-pulse and a main pulse to convert the target droplets to plasma which generates EUV light;

a collector mirror configured to reflect the EUV light and having an optical axis along a z-axis;

a first energy sensor and a second energy sensor configured to measure a variation in energy of the EUV light;

a final focus module configured to measure a separation between the pre-pulse and the main pulse along a y-axis, wherein the y-axis is perpendicular to the x-axis and the z-axis; and a controller coupled to the first energy sensor, the second energy sensor and the final focus module and programmed to:

determine whether the separation between the pre-pulse and the main pulse along the y-axis is different from a predetermined value; and adjust, in response to a determination that the separation between the pre-pulse and the main pulse along the y-axis is different from the predetermined value, a configurable parameter of the excitation laser module to set the within an acceptable range.

19. The apparatus of claim 18, wherein the excitation laser module comprises a steerable mirror configured to control a focal point of one of or both the pre-pulse and the main pulse;

wherein the controller is configured to control the steerable mirror to change the focal point of one of or both the pre-pulse and the main pulse based on the separation between the pre-pulse and the main pulse along the y-axis.

20. The apparatus of claim 19, wherein the steerable mirror is a last mirror in an optical path before the pre-pulse or the main pulse hit one of the target droplets.

* * * * *